United States Patent
Zheng et al.

(10) Patent No.: US 6,342,428 B1
(45) Date of Patent: Jan. 29, 2002

(54) METHOD FOR A CONSISTENT SHALLOW TRENCH ETCH PROFILE

(75) Inventors: Tammy Zheng, Fremont; Calvin Todd Gabriel, Cupertino; Edward K. Yeh, San Jose, all of CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/411,758

(22) Filed: Oct. 4, 1999

(51) Int. Cl.$^7$ ............................................. H01L 21/76
(52) U.S. Cl. .................. 438/424; 438/402; 438/433; 438/473; 156/643.1; 156/646.1; 156/657.1; 216/64; 216/67; 216/74; 216/80; 216/81
(58) Field of Search ................... 438/585, 584, 438/593, 694, 695, 703, 706, 709, 711, 723, 424, 402, 433, 473; 156/643.1, 646.1, 657.1; 216/64, 67, 79, 80, 81

(56) References Cited

U.S. PATENT DOCUMENTS

| | | | | |
|---|---|---|---|---|
| 5,616,513 A | * | 4/1997 | Shepard | 438/402 |
| 5,729,043 A | * | 3/1998 | Shepard | 257/519 |
| 5,792,706 A | * | 8/1998 | Michael et al. | 438/626 |
| 5,843,226 A | * | 12/1998 | Zhao et al. | 117/97 |
| 6,238,844 B1 | * | 2/1999 | Joubert et al. | 430/312 |
| 5,882,982 A | | 3/1999 | Zheng et al. | 438/424 |
| 6,143,635 A | * | 8/1999 | Boyd et al. | 438/585 |
| 5,948,701 A | * | 9/1999 | Chooi et al. | 438/694 |

* cited by examiner

Primary Examiner—David Nelms
Assistant Examiner—Renee' R. Berry
(74) Attorney, Agent, or Firm—Peter Zawilski (57) ABSTRACT

For use with a sub-micron semiconductor process, a trench isolation process improves the etch profile of trenches among dense and isolated lines. In an example embodiment, a process forms a dielectric stack of silicon dioxide, silicon nitride and silicon oxynitride on a silicon substrate. Photolithography and etch define trench regions in the silicon substrate through the dielectric stack. Silicon oxynitride acts as a hard mask reducing differences in the sidewall slope among dense areas of the semiconductor device and the sparse areas of the semiconductor device.

25 Claims, 4 Drawing Sheets

METHOD FOR A CONSISTENT SHALLOW TRENCH ETCH PROFILE

FIELD OF INVENTION

The present invention is generally directed to the manufacture of a semiconductor device. In particular, the present invention relates to a process that enables the formation of a consistent shallow trench etch profile.

BACKGROUND OF INVENTION

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, BiCMOS transistors.

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

One important stage in the manufacture of such devices is the formation of isolation areas to electrically separate the electrical devices or portions thereof, that are closely integrated in the silicon wafer. While the particular structure of a given active device can vary between device types, a MOS-type transistor generally includes source and drain regions and a gate electrode that modulates current flowing in a channel between the source and drain regions. Unintended current should not flow between source and drain regions of adjacent MOS-type transistors. However, during the manufacturing process, movement of dopant atoms, for example, of boron, phosphorus, arsenic, or antimony, can occur within the solid silicon of the wafer. This movement is referred to as diffusion. The diffusion process occurs at elevated temperatures where there is a concentration gradient between dopant atoms external to the silicon wafer and those dopant atoms within the silicon wafer. It is typically employed when forming p-type and n-type regions of a silicon integrated circuit device.

A technique referred to as "trench isolation" has been used to limit such low. A particular type of trench isolation is referred to as shallow trench isolation (STI). STI is often used to separate the respective diffusion regions of devices of the same polarity type (i.e., p-type versus n-type).

In forming the STI regions one technique uses either silicon nitride (SiN) or photoresist to mask the etch. It is desirable to have a profile with nearly vertical trench sidewalls and that this profile, for all trench sidewalls, be consistent across the device and wafer. However, in practice, the profile is dependent upon the device topology. In regions with isolated lines (wide spaces), the STI profiles are less vertical or more tapered. On the other hand, those regions with dense lines (narrow spaces) are more vertical or less tapered.

In an example, prior art process using SiN, a desirable profile specification is in the range of about 80°±3°. However, actual results indicate that the difference in slope between profiles in dense regions and isolated regions is about 7°, exceeding the specification.

Figure 1A:
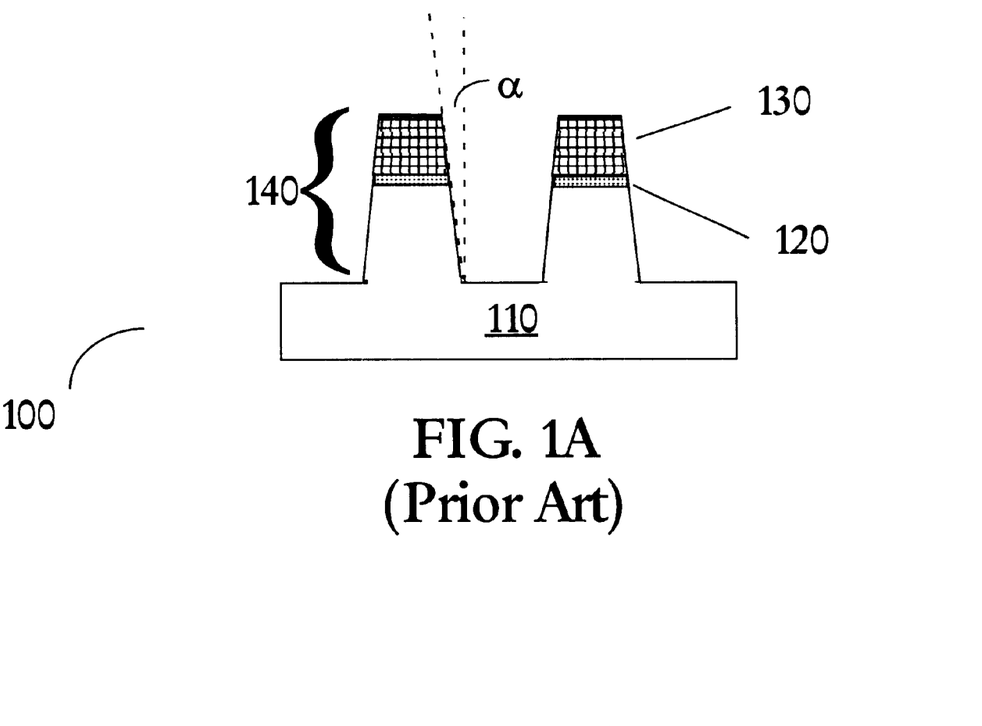
FIGS. 1A–1B illustrate in cross-section the profiles of the trenches fabricated from a prior-art process.

FIG. 1A, illustrated in cross-section, depicts a region 100 having a pair of dense lines. Substrate 110 which has a thin oxide layer 120 and silicon nitride layer 130 thereon, has undergone a trench etch. The resulting profile 140 has an angle α.

Figure 1B:
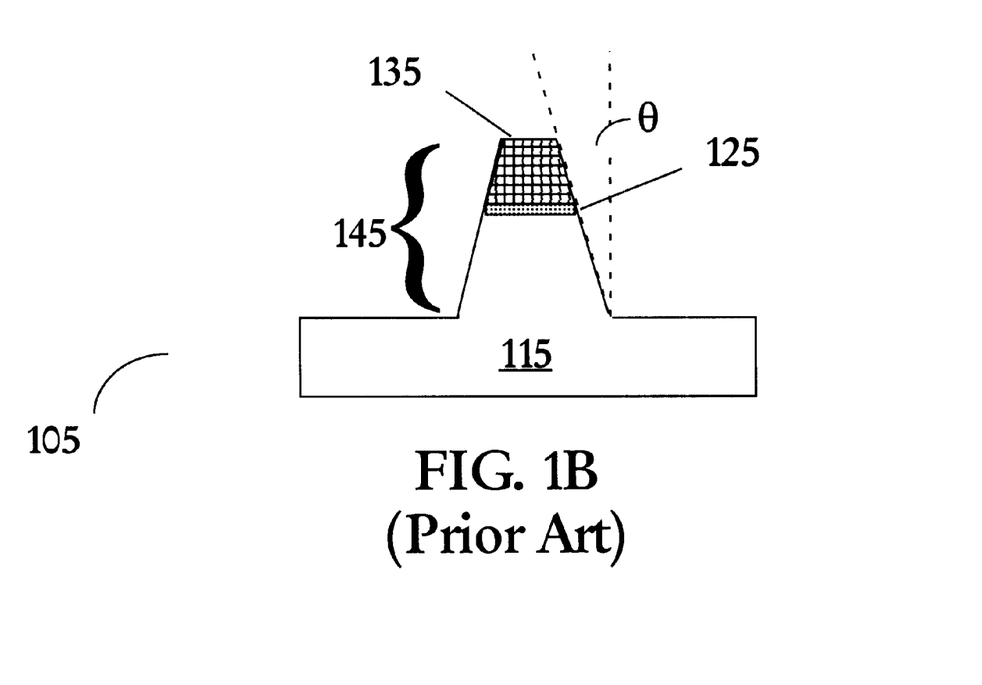

FIG. 1B depicts a region 105 in cross-section having a single isolated line. Substrate 115 having a thin oxide layer 125 and a nitride layer 135, has undergone a trench etch. The resulting profile 145 has an angle θ. Consequently, the angle α of FIG. 1A is smaller than the angle θ of FIG. 1B, indicating a more vertical slope profile 140 of FIG. 1A with respect to the slope profile 145 of FIG. 1B.

Accordingly, there is a need for a process that ensures a more consistent STI profile not dependent upon the device topology and provides good critical dimension control from wafer to wafer, lot to lot.

SUMMARY OF INVENTION

The present invention provides for the manufacturing of shallow trench isolation that has consistent profile in regions of dense and isolated lines. Advantages realized include the attainment of nearly vertical profiles across the varying line density in a particular device and throughout the wafer substrate. In achieving nearly vertical profiles, the active devices designed critical dimensions, as intended by the circuit designer and drawn on the mask plates, may be more accurately translated into the silicon substrate during manufacturing than those attained with conventional processes. Consequently, the yield and performance of the manufactured devices is consistent across wafer.

The invention is exemplified in a number of implementations, two of which are summarized below. According to one embodiment, a method of forming trench isolation regions on a substrate comprises forming a dielectric stack on the substrate. This dielectric stack is made of a layer of silicon dioxide, a layer of silicon nitride, and a layer of a profile dielectric. A trench region is defined in the substrate through the dielectric stack.

In another embodiment, a method forms trench isolation regions on a silicon substrate. First, the method defines a dielectric stack. The dielectric stack is masked and coat ed with a photoresist and the photoresist is exposed to light. The dielectric stack is etched with a first etch forming a trench region in unmasked areas of the dielectric stack. The dielectric stack is etched until the silicon substrate is exposed. After first etch, the photoresist is removed. With a second etch, the trench region is etched again until a trench region of sufficient depth in the silicon substrate is defined.

The above summary of the present invention is not intended to represent each disclosed embodiment, or every aspect, of the present invention. Other aspects and example embodiments are provided in the figures and the detailed description that follows

BRIEF DESCRIPTION OF THE DRAWINGS

The invention may be more completely understood in consideration of the following detailed description of various embodiments of the invention in connection with the accompanying drawings, in which.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found to be useful and advantageous in connection with etch processes, for example, as those used to manufacture MOS-type transistors. The present invention has been found to be particularly useful where it is difficult to control the etch profile across varying device topographies in the forming of silicon trenches as part of a trench isolation process. Typically, the trench isolation process includes forming shallow trenches in the silicon which ultimately are filled in with oxide or other suitable dielectric. In the discussion that follows, a MOS structure is used to describe an example implementation of the invention. However, the invention is not necessarily limited to MOS. It may be applied to alternate technologies such as bipolar, silicon on substrate, gallium arsenide, and combinations thereof.

According to the present invention, variations in the formation of the trench profiles as depicted in FIGS. 1A–1B, are avoided using the following example process. The example process deposits on the silicon wafer a passivation dielectric, usually silicon dioxide. Following the passivation dielectric deposition, a nitride deposition is applied forming a nitride hard mask. A vertical sidewall-enhancing dielectric is deposited on the nitride hard mask layer. This vertical sidewall-enhancing dielectric may be a silicon-oxynitride, $Si_xO_yN_z$ or a silicon-rich oxide, $SiO_x$. The difference in the dense-to-isolated line profile is reduced by the vertical sidewall-enhancing dielectric. The passivation dielectric, the nitride hard mask, and vertical sidewall-enhancing layer form a dielectric stack. Photolithography masks areas to etch. Stripping of the photo mask prepares the silicon wafer for the plasma etch of the silicon trenches. During the silicon trench etch, the dielectric stack protects the regions that ultimately define the active transistor areas. After the silicon trench etch, the trenches are filled with a dielectric, usually a HDP (high-density plasma) oxide. Having defined the trench isolation, the wafers undergo subsequent processing to further define the active transistor areas that comprise the circuits on a given device.

In another example embodiment according to the present invention, the process begins with a silicon substrate. Upon the silicon substrate, a thin layer of silicon dioxide is formed. In an example process, about 100 Å of $SiO_2$ is deposited on the silicon substrate. Following the oxide deposition, a substantially thicker layer of silicon nitride is deposited upon the thin oxide layer. In the example process, the process deposits about 1800 Å silicon nitride. Silicon oxynitride is deposited on the silicon nitride. Consequently, a silicon dioxide ($SiO_2$), silicon nitride (SiN), silicon-oxynitride ($SiO_xN_y$) stack is formed. Other dielectrics, such as silicon-rich oxide (SiO), may be used in place of $SiO_xN_y$ to achieve the desired trench profile. Through photolithography, the STI regions are masked with photoresist. Etch selective to the $SiO_xN_y$/SiN/$SiO_2$ stack proceeds until the silicon substrate is exposed. The photoresist mask is stripped. Using the $SiO_xN_y$ as a mask, the process etches shallow silicon trenches. Some or all of the $SiO_xN_y$ is removed depending upon its thickness and the etch selectivity. In certain applications, the opened trenches receive a fill deposition of oxide. In an example process, oxide is deposited at a thickness of between about 6000 Å to 9000 Å to fill trenches whose depths range from about 2500 Å to 3500 Å. A planarization process removes excess oxide. The remaining silicon nitride is used as an etch stop. In a modern sub-micron process, chemical-mechanical polishing (CMP) planarizes the features.

Figure 2A:
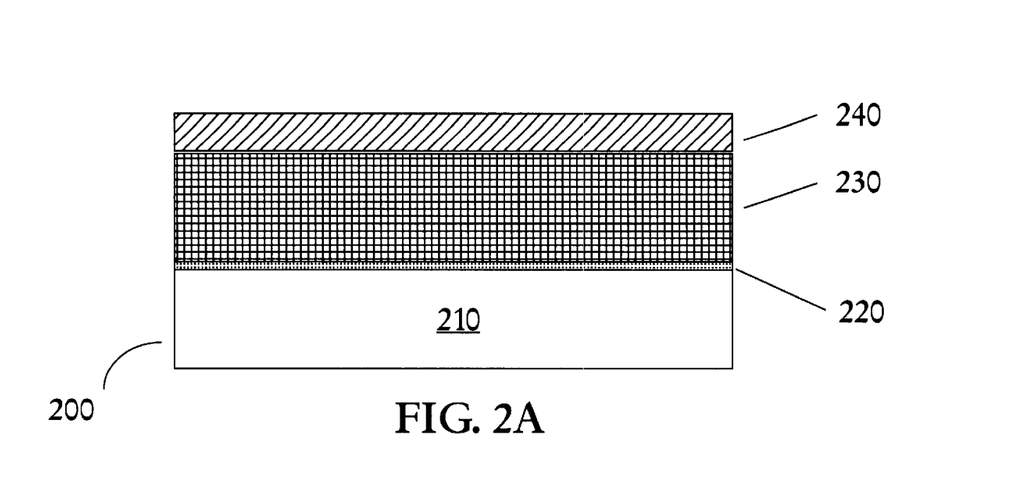
FIG. 2A illustrates in cross-section a silicon substrate having silicon dioxide, silicon nitride and silicon oxynitride layers according to an embodiment of the present invention.

FIG. 2A, is an example embodiment of forming trenches with consistent and nearly vertical sidewalls in areas with dense/isolated lines. According to the present invention, a structure 200, usually a silicon wafer 210 has a thin oxide layer 220 grown thereupon. Upon the thin oxide layer 220, the process deposites a silicon nitride layer 230. The substrate with this stack of dielectric layers is ready to have the trench areas defined. A $SiO_xN_y$ layer 240 of sufficient thickness is then deposited upon the silicon nitride layer 230. An added feature of using $SiO_xN_y$ is film's anti-reflective properties that reduce the reflection of light during a subsequent photo-lithographic patterning process. It is often advantageous to use ARC (anti-reflective coating) layers to reduce the broadening or narrowing of features.

Dielectric films may be formed in a number of ways. For example, the thin oxide 220 may be thermally grown on the substrate by exposing the substrate to an oxidizing ambient ($O_2$, $H_2O$) at elevated temperatures. Thermal oxidation produces $SiO_2$ films with controlled thickness and Si/$SiO_2$ interface properties. The range of thickness for a thermally grown $SiO_2$ film ranges from about 30 Å to 10,000 Å. Oxide, nitride, oxynitride films, and other dielectric films may be formed by chemical vapor deposition (CVD). CV may consist of the following sequence of stages: a) a given composition (and flow rate) of reactant gases and diluent inert gases is introduced into a reaction chamber; b) the gas species move to the substrate; c) the reactants are adsorbed on the substrate, that is a thin layer of gas molecules adhere to the surface of the substrate with which they are in contact; d) the adsorbed atoms undergo migration and film-forming chemical reactions, and e) the gaseous by-products of the reaction are desorbed and removed from the reaction chamber. Energy to drive the reactions can be supplied by several methods (e.g., thermal, photons, or electrons), but thermal energy is most commonly used. Variations on CVD include plasma enhanced chemical vapor deposition (PECVD), atmospheric pressure chemical vapor deposition (APCVD), and low pressure chemical vapor deposition (LPCD). These CVD methods are conventional.

In an example 0.13 $\mu$m process as applied to the present invention, the wafer passivating oxide may have a thickness of about 100 Å. The SiN thickness may be about 1800 Å, and the $SiO_xN_y$ thickness may be about 570 Å.

In an example 0.25 $\mu$m process, as applied to the present invention, the wafer passivating oxide may have a thickness of about 200 Å. The SiN thickness may be about 1925 Å, and the $SiO_xN_y$ thickness may be about 700 Å. However, for a given process, the thickness of the dielectric stack layers may fall within a number of ranges.

In that the present invention is applicable to a number of processes with varying critical dimensions (CDs), and that the CDs are approaching smaller sizes, the dielectric stack may be built in a range of layer thickness.

In a range of example processes, the $SiO_2$ thickness may between about 50 Å to 250 Å. The SiN thickness may between about 900 Å and 2700 Å. The $SiO_xN_y$ thickness may between about 200 Å to 900 Å. Having formed the dielectric stack, the trench areas are defined.

Figure 2B:
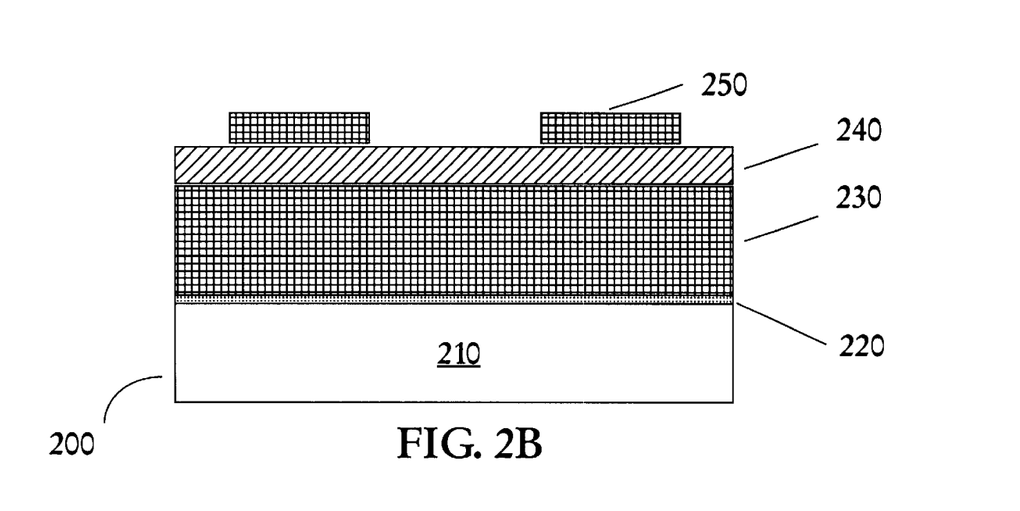
FIG. 2B depicts the structure of FIG. 2A with a photoresist applied.

Referring to FIG. 2B, photolithography defines the trench areas. Mask layer 250 defines the trench region that is etched.

Figure 2C:
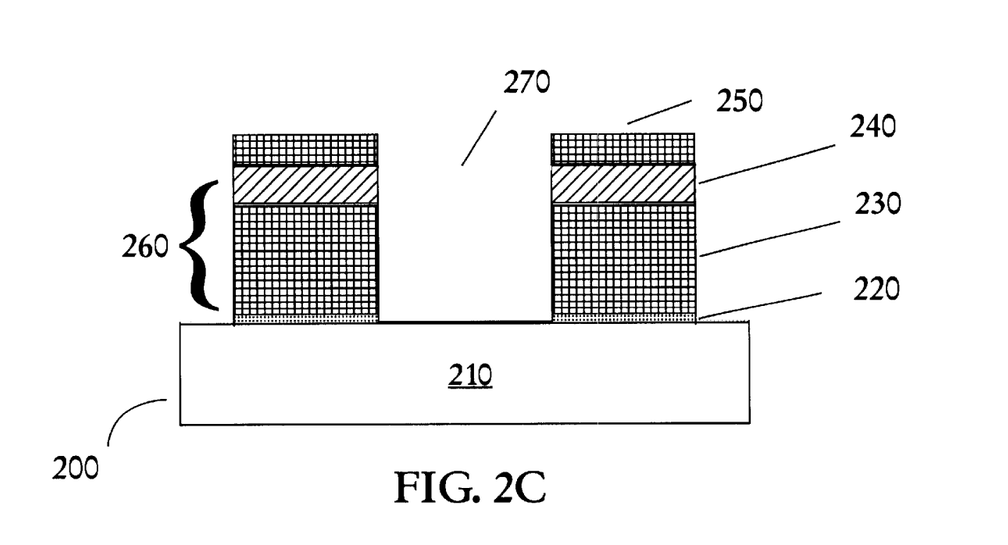
FIG. 2C depicts the structure of FIG. 2B after etch stopping on the silicon substrate.
Figure 2D:
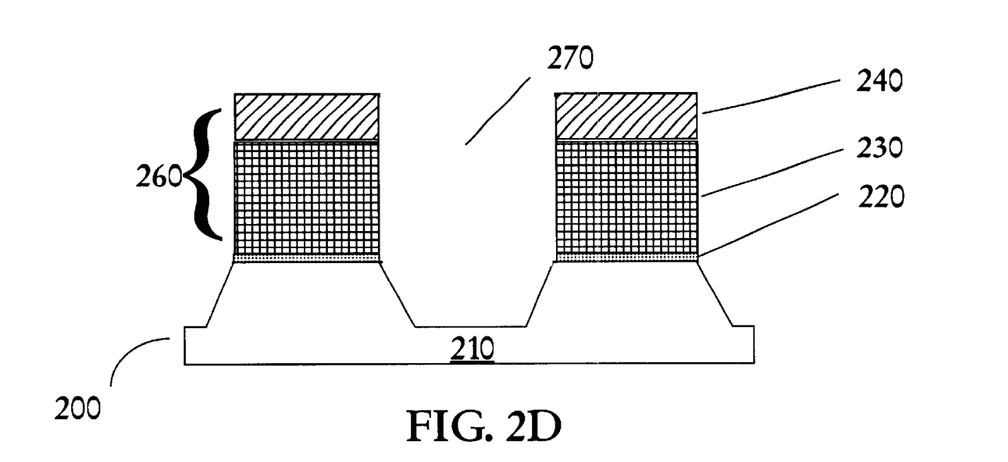
FIG. 2D depicts the structure of FIG. 2C after trench etch using the exposed silicon oxynitride as a mask.

Referring to FIG. 2C, in an example process, the $SiO_xN_y$/SiN/$SiO_2$ stack 260 undergoes a plasma etch. The etch removes the material of the stack 260 and continues until it stops on the silicon substrate 210. A trench region 270 remains. The mask layer 250 is stripped off. The stripping of the photoresist may be accomplished by either stripping with a solvent or "burned" off through an ashing process with an $O_2$ plasma. As mentioned earlier, in an example embodiment according to the present invention, for use with 248 nm optical lithography, the stack is about 570 Å $SiO_xN_y$ about 1800 Å SiN and about 100 Å $SiO_2$. The $SiO_xN_y$/SiN/$SiO_2$ stack 260 serves as be mask for the subsequent silicon trench etch. After the silicon trench etch as shown in FIG. 2D, the trench is usually filled with a HDP oxide (not illustrated). After filling the trench, the process undergoes a chemical mechanical polishing (CMP) to smooth out the device topography for subsequent processing. The $SiO_xN_y$/SiN/$SiO_2$ stack 260 acts as an etch stop that is subsequently removed to define the active regions of the devices separated by shallow trench isolation.

Figure 3:
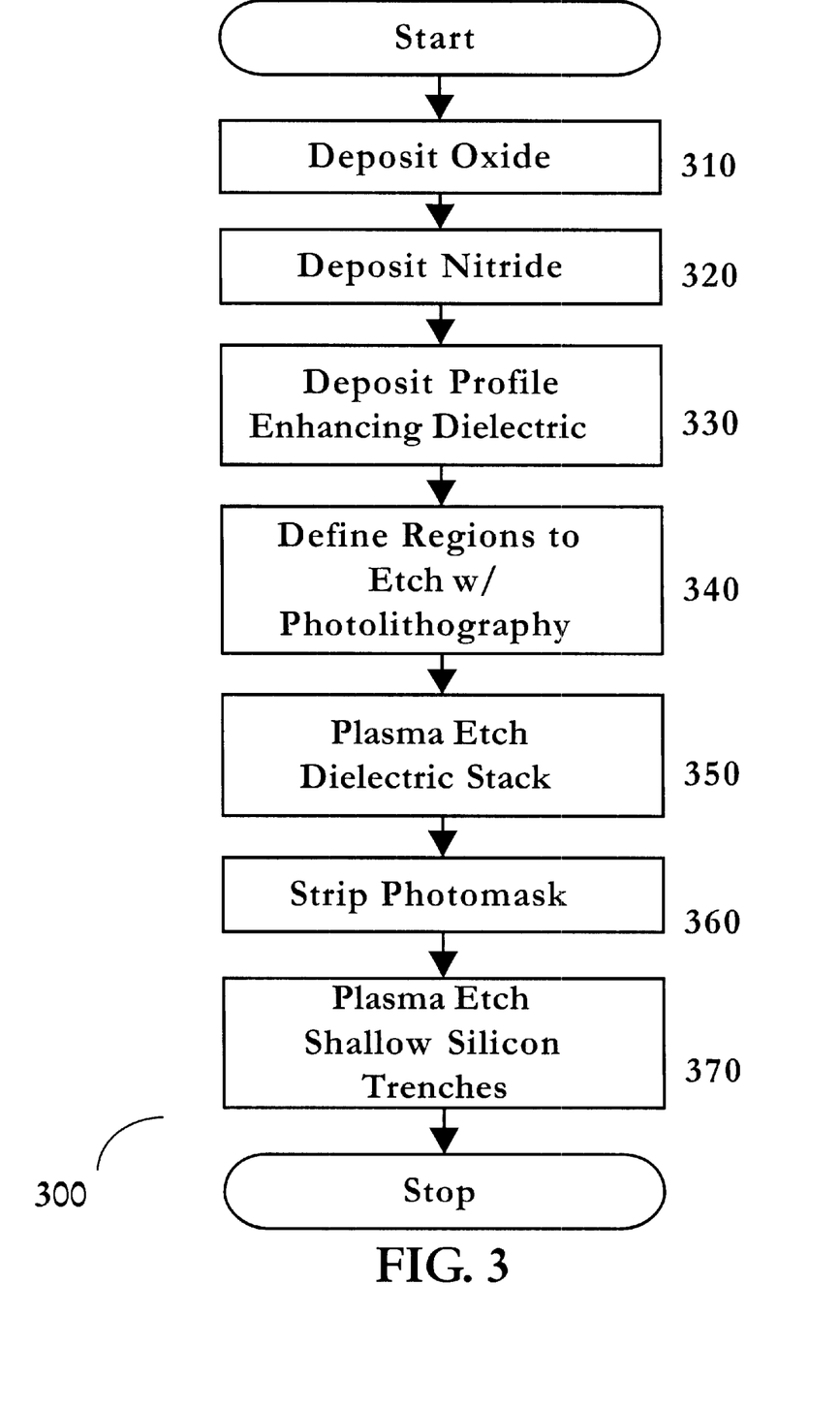
FIG. 3 is an example process according to the present invention.

The desired trench etch profile may be attained with the example process 300 as outlined in FIG. 3. The silicon wafer receives an oxide deposition 310. Following the oxide deposition 310, a nitride deposition 320 is applied. A profile-enhancing deposition 330 is deposited on the nitride deposition 320. This deposition 330 is silicon-oxynitride or a silicon-rich oxide, $SiO_x$. Photolithography techniques define regions to etch 340. After masking 340, the dielectric stack undergoes plasma etch 350 in a process that maintains the consistent profile. Stripping of the photo mask 360 prepares the silicon wafer for the plasma etch of the shallow silicon trenches 370.

Tables 1–2 outline a specific example process of forming trenches with consistent and nearly vertical sidewalls in area with dense/isolated lines, according to the present invention. Referring to Table 1, the "Dielectric Stack Etch," Stage 01 begins with loading wafers into a first plasma etch apparatus; the apparatus is pumped down to vacuum conditions. For the example process, the Dielectric Stack Etch uses a Lam Research Corporation, Model 4520 plasma etch system as a first etch apparatus. The electrode temperature is maintained at 10° C. and the chamber temperature is maintained at about 60° C. throughout the process. Approximately 30 seconds are required to achieve a stable vacuum. Going to Stage 02, the species of etchant gases, $CF_4$ and $O_2$ are introduced into the chamber at flow rates of about 90 standard cubic centimeters per minute (sccm), and 23 sccm, respectively. Chamber pressure is maintained at about 200 mT (milli-Torr). Approximately 30 seconds is sufficient to stabilize the gas flows.

TABLE 1

Dielectric Stack Etch

| Step | Purge chamber Stage 1 | Gas stability Stage 2 | Ignite plasma Stage 3 | SiON/SiN etch Stage 4 | Gas stability Stage 5 | SiO2 etch Stage 6 | Dechuck #1 Stage 7 | Dechuck #2 Stage 8 | End Stage 9 |
|---|---|---|---|---|---|---|---|---|---|
| Pressure (mTorr) | 500 | 200 | 200 | 200 | 200 | 200 | 300 | 300 | 300 |
| RF Power (W) | 0 | 0 | 675 | 1350 | 0 | 1350 | 0 | 0 | 0 |
| LoFAT Tap | 3 | 3 | 3 | 3 | 3 | 3 | 0 | 0 | 0 |
| ESC (V) | 2000 | 400 | 400 | 400 | 400 | 400 | −1 | −2000 | 0 |
| Gap (cm) | 1.05 | 1.05 | 1.05 | 1.05 | 1.05 | 1.05 | 5.53 | 5.53 | 5.53 |
| Ar (sccm) | 200 | 150 | 150 | 150 | 150 | 150 | 100 | 100 | 100 |
| CF4 (sccm) | 0 | 90 | 90 | 90 | 90 | 90 | 0 | 0 | 0 |
| O2 (sccm) | 0 | 21 | 21 | 21 | 0 | 0 | 0 | 0 | 0 |
| He Clamp (Torr) | 0 | 10 | 10 | 10 | 10 | 10 | 0 | 0 | 0 |
| Completion | Time | Stabl | Time | Endpt | Stabl | Oetch | Time | Time | End |
| Time (sec) | 4 | 30 | 2 | 36* | 30 | 35% | 1 | 4 | 30 |
| Channel | | | | 483 nm | | | | | |
| Delay (sec) | | | | 19 | | | | | |
| Norm (sec) | | | | 4 | | | | | |
| Trigger | | | | 105% | | | | | |
| Temperatures | (° C.) | | | | | | | | |
| Lower Electrode | 10 | | | | | | | | |
| Upper Electrode | 40 | | | | | | | | |

*= The maximum step time is 36 sec. The typical endpoint time is 28 sec.

In the first plasma etch apparatus, the etching process begins at Stages 03–04 for "$SiO_xN_y$/SiN" etch. The unmasked regions of silicon oxynitride and silicon nitride of the dielectric stack undergo etch. For about 25 to 40 seconds (until the endpoint is reached) at an RF power of about 1350 watts (W), the wafers are plasma etched with the $CF_4$ and $O_2$ combination. An endpoint indication at a trigger point of about 105% signals the completion of Stage 04. Moving on to Stage 05, the RF power is shut off, and the $O_2$ flow is cut off. For about 30 seconds, the chamber is allowed to stabilize to the process conditions required for Stage 06. During the stack etch, argon (Ar) is blended with the $CF_4$ and $O_2$ at a flow rate of about 150 sccm. At Stage 06, the etch process resumes with only $CF_4$ to remove the $SiO_2$. Other conditions remain the same. Etching proceeds for a time determined to expose bare silicon.

The process completes Stages 07–09 when the etchant gases and RF power are switched off and the wafer is de-chucked. Wafers are removed from the first plasma etching apparatus having completed the dielectric stack etch. The wafers then proceed to the trench etch stage.

Referring to Table 2, the "Shallow Silicon Trench Etch" process is used to etch the trench regions of the semiconductor device. The Shallow Silicon Trench Etch uses a Lam Research Corporation Model TCP 9400SE silicon plasma etch system as a second plasma etch apparatus. In the second plasma etch apparatus, the silicon etch process, Stage 01 begins with loading wafers into an etching chamber; the chamber is pumped down to vacuum conditions and $CF_4$ is introduced. Stage 02 is for removing the native oxide that grows on bare silicon upon exposure to the air. This Stage would not be needed in a "cluster" tool there the wafer is kept under vacuum conditions between the dielectric stack etch and trench etch. Such a tool may comprise multiple etch chambers or processes.

TABLE 2

Shallow Silicon Trench Etch

| Shallow Silicon Trench Etch | Gas stability Stage 01 | Clean Si surface Stage 02 | Gas stability Stage 03 | Trench etch Stage 04 | Pump chamber Stage 05 | End Stage 06 |
|---|---|---|---|---|---|---|
| Pressure (mTorr) | 10 | 10 | 30 | 30 | 0 | 0 |
| RF-Top (W) | 0 | 250 | 0 | 250 | 0 | 0 |
| RF-Bottom (W) | 0 | 65 | 0 | 80 | 0 | 0 |
| Gap (cm) | 8.1 | 8.1 | 8.1 | 8.1 | 8.1 | 8.1 |
| Cl2 (sccm) | 0 | 0 | 35 | 35 | 0 | 0 |
| HBr (sccm) | 0 | 0 | 150 | 150 | 0 | 0 |
| 80% He—O2 (sccm) | 0 | 0 | 10 | 10 | 0 | 0 |
| CF4 (sccm) | 100 | 100 | 0 | 0 | 0 | 0 |
| N2 (sccm) | 0 | 0 | 23 | 23 | 0 | 0 |
| He clamp (Torr) | 8 | 8 | 8 | 8 | 0 | 0 |
| Completion | Stabl | Time | Stabl | Time | Time | End |
| Time (sec) | 30 | 10 | 30 | 90** | 7 | 0 |
| Temperatures (° C.) | | | | | | |
| Bottom Electrode | 60 | | | | | |
| Chamber | 60 | | | | | |

**= 90 sec is typical but is adjusted to meet the required trench depth

Going to Stage 03, the species of etchant gases, $Cl_2$ and HBr, $HeO_2$ and $N_2$ are introduced into the chamber at flow rates of about 35 sccm, 150 sccm, 10 sccm, and 20 sccm, respectively. Note that $HeO_2$ is a mixture of 80% He and 20% $O_2$. Chamber pressure is held at about 30 mT. Bottom electrode temperature is set to about 60° C. The gas flows require approximately 30 seconds to stabilize.

Acting as a hard mask, silicon oxynitride/silicon nitride/silicon dioxide of the dielectric stack protect regions of silicon not undergoing trench etch. At Stage 03, exposed silicon regions, for about 90 seconds at a "Top RF" power of about 250 watts (W) and 80 watts "Bottom-RF" power, the wafers are plasma etched with the $Cl_2$, HBr, $HeO_2$, and $N_2$ combination.

The process completes Stage 04 when the etchant gases and RF power are switched off, and the system pumps down to vacuum during Stages 05–06. Wafers are removed from the second plasma etching apparatus for the deposition of an oxide to fill in the trench and further processing.

While the present invention has been described with reference to several particular example embodiments, those skilled in the art will recognize that many changes may be made thereto without departing from the spirit and scope of the present invention, which is set forth in the following claims.

What is claimed:

1. A method of forming a trench isolation region on a substrate comprising:
    forming a dielectric stack on the substrate, the dielectric stack including a wafer passivating dielectric layer, a hard mask layer, and a profile dielectric layer, the profile dielectric layer enhancing formation of at least one vertical sidewall; and
    defining a trench region in the substrate through the dielectric stack.

2. The method of claim 1 wherein,
    the profile dielectric is selected from the group of $SiO_xN_y$ and $SiO_x$;
    the wafer passivating dielectric is silicon dioxide; and
    the hard mask layer is selected from the group of silicon nitride dielectrics.

3. The method of claim 1 wherein defining the trench region comprises:
    masking the dielectric stack with a photo resist, exposing the photo resist to light;
    etching a trench pattern by etching unmasked areas of the dielectric stack with a first etch until the substrate is exposed;
    removing the photo resist; and
    forming a trench by etching the trench pattern with a second etch until the trench is of a sufficient depth.

4. The method of claim 3 wherein the depth of the trench is in the range of about 2500 Å to about 5000 Å.

5. The method of claim 3 wherein the depth of the trench is at least the thickness of some of the removed dielectric stack.

6. The method of claim 3 wherein forming the trench proceeds until substantially all of the profile dielectric is removed.

7. The method of claim 1 wherein the forming of the dielectric stack is with chemical vapor deposition.

8. The method of claim 1 wherein the layer of silicon dioxide is formed by a process selected from the group of the following: thermal growth, PECVD, APCVD, LPCVD, TEOS, and $SiCl_2H_2+H_2O$;
    wherein the layer of silicon nitride is formed by a process selected from the group of the following: PECVD, APCVD, and LPCVD; and
    wherein the profile enhancing dielectric is formed by a process selected from the group of the following: PECVD, APCVD, and LPCVD.

9. The method of claim 3 wherein the first etch is a gas comprising Ar, $O_2$, and at least one fluorine-containing gas selected from the following: $CF_4$, $C_2F_6$, and $CHF_3$; and
   wherein the second etch is a gas comprising $Cl_2$, HBr, $HeO_2$, and $N_2$.

10. The method of claim 3 wherein the first etch comprises:
    introducing a first process gas comprising Ar, $CF_4$, and $O_2$ onto the substrate, the volumetric flow of Ar being in the range of about 0 sccm to 1000 sccm, the volumetric flow of a fluorine-containing gas selected from the following: $CF_4$, $C_2F_6$, and $CHF_3$ being in the range of about 10 sccm to 1000 sccm; and the volumetric flow of $O_2$ being in the range of about 1 sccm to 500 sccm; and
    generating a plasma to form a first etch gas from the process gas;
    etching the dielectric stack with the first etch gas, stopping on the substrate layer; and
   wherein the second etch comprises;
    introducing a second process gas comprising $Cl_2$, HBr, $HeO_2$, $N_2$ onto the substrate, the volumetric flow of $Cl_2$ being in the range of about 10 sccm to 200 sccm, the volumetric flow of HBr being in the range of about 50 sccm to 500 sccm; and the volumetric flow of $HeO_2$ being in the range of about 3 sccm to 50 sccm, and the volumetric flow of $N_2$ being in the range of about 5 sccm to 200 sccm; and
    generating a plasma to form a second etch gas from the second process gas; and
    etching the trench pattern with the second etch gas.

11. The method of claim 3 wherein the first etch comprises:
    introducing a first process gas comprising Ar, $CF_4$, and $O_2$ onto the substrate, the volumetric flow of Ar being in the range of about 125 sccm to 175 sccm, the volumetric flow of a fluorine-containing gas selected from the following: $CF_4$, $C_2F_6$, and $CHF_3$ being in the range of about 85 sccm to 130 sccm; and the volumetric flow of $O_2$ being in the range of about 18 sccm to 27 sccm;
    generating a plasma to form a first etch gas from the process gas;
    etching the dielectric stack with the first etch gas, stopping on the substrate layer; and
   wherein the second etch comprises;
    introducing a second process gas comprising $Cl_2$, HBr, $HeO_2$, $N_2$ onto the substrate, the volumetric flow of $Cl_2$ being in the range of about 25 sccm to 45 sccm, the volumetric low of HBr being in the range of about 105 sccm to 195 sccm; and the volumetric flow of $HeO_2$ being in the range of about 7 sccm to 13 sccm and the volumetric flow of $N_2$ being in the range of about 15 sccm to 25 sccm;
    generating a plasma to form a second etch gas from the second process gas; and
    etching the trench pattern with the second etch gas.

12. The method of claim 3, wherein the first etch comprises:
    introducing a first process gas comprising Ar, $CF_4$, and $O_2$ onto the substrate, the volumetric flow of Ar being in the range of about 125 sccm to 175 sccm, the volumetric flow of $CF_4$ being in the range of about 85 sccm to 130 sccm; and the volumetric flow of $O_2$ being in the range of about 18 sccm to 27 sccm;
    generating a plasma to form a first etch gas from the process gas;
    etching the dielectric stack with the first etch gas, stopping on the silicon dioxide layer;
    modifying the first process gas by turning off the flow $O_2$;
    generating another plasma of the first etch gas from the modified first process gas;
    resuming etching of the dielectric stack on the silicon dioxide layer with the first etch gas, stopping on the substrate; and
   wherein the second etch comprises;
    introducing a third process gas comprising $Cl_2$, HBr, $HeO_2$, $N_2$ onto the substrate, the volumetric flow of $Cl_2$ being in the range of about 25 sccm to 45 sccm, the volumetric flow of HBr being in the range of about 105 sccm to 195 sccm; and the volumetric flow of $HeO_2$ being in the range of about 7 sccm to 13 sccm and the volumetric flow of $N_2$ being in the range of about 15 sccm to 25 sccm;
    generating a plasma to form a third etch gas from the third process gas; and
    etching the trench pattern with the third etch gas.

13. The method of claim 3, wherein the first etch comprises:
    introducing a first process gas comprising Ar, $CF_4$, and $O_2$ onto the substrate, the volumetric flow of Ar being in the range of about 125 sccm to 175 sccm, the volumetric flow of $CF_4$ being in the range of about 85 sccm to 130 sccm; and the volumetric flow of $O_2$ being in the range of about 18 sccm to 27 sccm;
    generating a plasma to form a first etch gas from the process gas;
    etching the dielectric stack with the first etch gas, stopping on the silicon dioxide layer;
    changing to a process gas, wherein the second etch gas comprises gases of the first etch gas without $O_2$;
    generating another plasma to form a second etch gas from the second process gas;
    resuming etching of the dielectric stack on the silicon dioxide layer with the second etch gas, stopping on the substrate; and
   wherein the second etch comprises;
    introducing a third process gas comprising $Cl_2$, HBr, $HeO_2$, $N_2$ onto the substrate, the volumetric flow of $Cl_2$ being in the range of about 25 sccm to 45 sccm, the volumetric flow of HBr being in the range of about 105 sccm to 195 sccm; and the volumetric flow of $HeO_2$ being in the range of about 7 sccm to 13 sccm and the volumetric flow of $N_2$ being in the range of about 15 sccm to 25 sccm; and
    generating a plasma to form a third etch gas from the third process gas; and
    etching the trench pattern with the third etch gas.

14. A method of forming a trench isolation region on a silicon substrate comprising:
    defining a dielectric stack including a wafer passivating dielectric layer, a hard mask layer, and a profile dielectric layer, the profile dielectric layer enhancing formation of at least one vertical sidewall;
    masking the dielectric stack with a photo resist and exposing the photo resist to light;
    etching the dielectric stack with a first etch, forming a trench region in unmasked areas of the dielectric stack until the silicon substrate is exposed;
    removing the photo-resist; and
    changing to a second etch and resuming etching of the trench region until a trench region of sufficient depth is defined.

15. The method of claim 14 wherein the dielectric stack comprises:
   depositing the wafer passivating dielectric layer on the silicon wafer;
   depositing the hard mask layer on the wafer passivating dielectric layer; and
   depositing the profile dielectric layer on the wafer passivating dielectric layer.

16. The method of claim 15,
   wherein the wafer passivating dielectric layer is silicon dioxide;
   wherein the hard mask layer is silicon nitride; and
   wherein the profile dielectric layer is silicon-oxynitride.

17. The method of claim 16 wherein the etching of the trench region continues until substantially all of the silicon-oxynitride layer is removed.

18. The method of claim 17 wherein the silicon dioxide layer has a thickness in the range of about 50 Å to 300 Å;
   wherein the silicon nitride layer has a thickness in the range of about 1500 Å to about 3000 Å; and
   wherein the silicon oxynitride layer has a thickness in the range of about 200 Å to about 2500 Å.

19. The method of claim 17 wherein the trench region depth is in the range of about 2000 Å to 5000 Å.

20. The method of claim 17 wherein the trench region depth is in the range of about 2500 Å to 3500 Å.

21. The method of claim 14 wherein the first etch is a gas comprising Ar, $O_2$, and at least one fluorine-containing gas selected from the following: $CF_4$, $C_2F_6$, and $CHF_3$; and
   wherein the second etch is a gas comprising $Cl_2$, HBr, $HeO_2$, and $N_2$.

22. The method of claim 14 wherein the first etch comprises:
   introducing a first process gas comprising Ar, $CF_4$, and $O_2$ onto the substrate, the volumetric flow of Ar being in the range of about 0 sccm to 1000 sccm, the volumetric flow of a fluorine-containing gas selected from the following: $CF_4$, $C_2F_6$, and $CHF_3$ being in the range of about 10 sccm to 1000 sccm; and the volumetric flow of $O_2$ being in the range of about 1 sccm to 500 sccm; and
   generating a plasma to Form a first etch gas from the process gas;
   etching the dielectric stack with the first etch gas, stopping on the substrate layer; and
wherein the second etch comprises;
   introducing a second process gas comprising $Cl_2$, HBr, $HeO_2$, $N_2$ onto the substrate, the volumetric flow of $Cl_2$ being in the range of about 10 sccm to 200 sccm, the volumetric flow of HBr being in the range of about 50 sccm to 500 sccm; and the volumetric flow of $HeO_2$ being in the range of about 3 sccm to 50 sccm and the volumetric flow of $N_2$ being in the range of about 5 sccm to 200 sccm; and
   generating a plasma to form a second etch gas from the second process gas; and
   etching the trench pattern with the second etch gas.

23. The method of claim 14 wherein the first etch comprises:
   introducing a first process gas comprising Ar, $CF_4$, and $O_2$ onto the substrate, the volumetric flow of Ar being in the range of about 125 sccm to 175 sccm, the volumetric flow of a fluorine-containing gas selected from the following: $CF_4$, $C_2F_6$, and $CHF_3$ being in the range of about 85 sccm to 130 sccm; and the volumetric flow of $O_2$ being in the range of about 18 sccm to 27 sccm; and
   generating a plasma to form a first etch gas from the process gas;
   etching the dielectric stack with the first etch gas, stopping on the substrate layer; and
wherein the second etch comprises;
   introducing a second process gas comprising $Cl_2$, HBr, $HeO_2$, $N_2$ onto the substrate, the volumetric flow of $Cl_2$ being in the range of about 25 sccm to 45 sccm, the volumetric flow of HBr being in the range of about 105 sccm to 195 sccm; and the volumetric flow of $HeO_2$ being in the range of about 7 sccm to 13 sccm and the volumetric flow of $N_2$ being in the range of about 15 sccm to 25 sccm; and
   generating a plasma to form a second etch gas from the second process gas; and
   etching the trench pattern with the second etch gas.

24. The method of claim 14 wherein the first etch comprises:
   introducing a first process gas comprising Ar, $CF_4$, and $O_2$ onto the substrate, the volumetric flow of Ar being in the range of about 125 sccm to 175 sccm, the volumetric flow of $CF_4$ being in the range of about 85 sccm to 130 sccm; and the volumetric flow of $O_2$ being in the range of about 18 sccm to 27 sccm; and
   generating a plasma to form a first etch gas from the process gas;
   etching the dielectric stack with the first etch gas, stopping on the silicon dioxide layer;
   modifying the first process gas by turning off the flow $O_2$;
   generating another plasma of the first etch gas from the modified first process gas;
   resuming etching of the dielectric stack on the silicon dioxide layer with the first etch gas, stopping on the substrate; and
wherein the second etch comprises;
   introducing a third process gas comprising $Cl_2$, HBr, $HeO_2$, $N_2$ onto the substrate, the volumetric flow of $Cl_2$ being in the range of about 25 sccm to 45 sccm, the volumetric flow of HBr being in the range of about 105 sccm to 195 sccm; and the volumetric flow of $HeO_2$ being in the range of about 7 sccm to 13 sccm and the volumetric flow of $N_2$ being in the range of about 15 sccm to 25 sccm; and
   generating a plasma to form a third etch gas from the third process gas; and
   etching the trench pattern with the third etch gas.

25. The method of claim 14 wherein the first etch comprises:
   introducing a first process gas comprising Ar, $CF_4$, and $O_2$ onto the substrate, the volumetric flow of Ar being in the range of about 125 sccm to 175 sccm, the volumetric flow of $CF_4$ being in the range of about 85 sccm to 130 sccm; and the volumetric flow of $O_2$ being in the range of about 18 sccm to 27 sccm; and
   generating a plasma to form a first etch gas from the process gas;
   etching the dielectric stack with the first etch gas, stopping on the silicon dioxide layer;
   changing to a process gas, wherein the second etch gas comprises gases of the first etch gas without $O_2$;
   generating another plasma to form a second etch gas from the second process gas;

resuming etching of the dielectric stack on the silicon dioxide layer with the second etch gas, stopping on the substrate; and wherein the second etch comprises;

introducing a third process gas comprising $Cl_2$, HBr, $HeO_2$, $N_2$ onto the substrate, the volumetric flow of $Cl_2$ being in the range of about 25 sccm to 45 sccm, the volumetric flow of HBr being in the range of about 105 sccm to 195 sccm; and the volumetric flow of $HeO_2$ being in the range of about 7 sccm to 13 sccm and the volumetric flow of N, being in the range of about 15 sccm to 25 sccm; and generating a plasma to form a third etch gas from the third process gas; and etching the trench pattern with the third etch gas.

* * * * *